US009674966B2

(12) United States Patent
Gelissen et al.

(10) Patent No.: US 9,674,966 B2
(45) Date of Patent: Jun. 6, 2017

(54) PROCESS OF DEPOSITING A METALLIC PATTERN ON A MEDIUM

(71) Applicant: DSM IP ASSETS B.V., Heerlen (NL)

(72) Inventors: Franciscus Wilhelmus Maria Gelissen, Echt (NL); Raul Marcelino Perez Graterol, Echt (NL)

(73) Assignee: DSM IP ASSETS B.V., Heerlen (NL)

( * ) Notice: Subject to any disclaimer, the term of this patent is extended or adjusted under 35 U.S.C. 154(b) by 0 days.

(21) Appl. No.: 14/647,377

(22) PCT Filed: Nov. 27, 2013

(86) PCT No.: PCT/EP2013/074806
§ 371 (c)(1),
(2) Date: May 26, 2015

(87) PCT Pub. No.: WO2014/083028
PCT Pub. Date: Jun. 5, 2014

(65) Prior Publication Data
US 2015/0305168 A1    Oct. 22, 2015

(30) Foreign Application Priority Data

Nov. 27, 2012 (EP) .................................. 12194391

(51) Int. Cl.
| | | |
|---|---|---|
| H05K 1/00 | (2006.01) | |
| H05K 3/38 | (2006.01) | |
| C23C 14/04 | (2006.01) | |
| C23C 14/28 | (2006.01) | |
| C23C 14/58 | (2006.01) | |
| C23C 18/16 | (2006.01) | |
| C23C 18/18 | (2006.01) | |
| H05K 1/03 | (2006.01) | |
| H05K 3/00 | (2006.01) | |
| H05K 3/18 | (2006.01) | |

(52) U.S. Cl.
CPC .......... *H05K 3/387* (2013.01); *C23C 14/048* (2013.01); *C23C 14/28* (2013.01); *C23C 14/584* (2013.01); *C23C 18/1608* (2013.01); *C23C 18/1612* (2013.01); *C23C 18/1868* (2013.01); *C23C 18/1882* (2013.01); *H05K 1/0353* (2013.01); *H05K 3/0032* (2013.01); *H05K 3/182* (2013.01); *H05K 3/381* (2013.01); *H05K 3/388* (2013.01); *B41M 2205/08* (2013.01); *H05K 2201/0108* (2013.01); *H05K 2203/072* (2013.01); *H05K 2203/107* (2013.01)

(58) Field of Classification Search
CPC . H05K 3/02; H05K 3/04; H01L 21/02; H01L 21/268; C23C 14/04; C23C 14/28; B41C 1/10; B41M 3/14; B41M 5/24; B41M 5/40; B41M 5/46; B41M 5/50; B41M 5/52

USPC ........... 174/250; 427/597; 428/323; 430/20, 430/202, 5, 58; 438/676; 118/726; 219/121.66; 505/474
See application file for complete search history.

(56) References Cited

U.S. PATENT DOCUMENTS

| | | | | |
|---|---|---|---|---|
| 3,962,513 A | * | 6/1976 | Eames ................. | B41C 1/1091 101/470 |
| 3,978,247 A | * | 8/1976 | Braudy ............. | B41M 5/38207 347/264 |
| 4,702,958 A | * | 10/1987 | Itoh ........................ | B41M 5/465 346/135.1 |
| 4,895,735 A | * | 1/1990 | Cook .................... | C23C 14/048 156/234 |
| 4,970,196 A | * | 11/1990 | Kim .................... | C04B 41/4529 257/E21.347 |
| 5,171,650 A | * | 12/1992 | Ellis ....................... | B41M 3/14 430/20 |
| 5,173,441 A | * | 12/1992 | Yu ........................ | C23C 14/048 219/121.68 |
| 5,256,506 A | * | 10/1993 | Ellis ....................... | B41M 5/24 346/135.1 |
| 5,567,336 A | * | 10/1996 | Tatah .................... | C23C 14/048 156/272.8 |

(Continued)

FOREIGN PATENT DOCUMENTS

| | | |
|---|---|---|
| CN | 201567366 | 9/2010 |
| CN | 102637561 | 8/2012 |
| WO | WO 00/44960 | 8/2000 |

OTHER PUBLICATIONS

Hanada et al., "Micromachining of transparent materials by laser-induced plasma-assisted ablation (LIPAA)", *The Institution of Electrical Engineers*, 2004, pp. 526-531.

(Continued)

*Primary Examiner* — Xiaoliang Chen
(74) *Attorney, Agent, or Firm* — Nixon & Vanderhye P.C.

(57) ABSTRACT

Process of depositing a metallic pattern on a medium, said process comprising: generating pulsed laser beams from a pulsed laser source, wherein the laser beams have a wavelength for which the medium is substantially transparent, focussing the laser beams onto a target layer comprising inorganic particles, dispersed in a laser light degradable/combustible organic matrix, said target layer producing ejecta in response to an interaction of said laser beams and said target layer, accumulating at least a portion of said ejecta on said medium within the desired pattern, providing the pattern by electroless metal plating. The invention further relates to a transparent medium comprising a metallic pattern wherein the adhesion between the metallic pattern and the medium is at least 5N/cm.

5 Claims, No Drawings

(56) References Cited

U.S. PATENT DOCUMENTS

| | | | | |
|---|---|---|---|---|
| 5,725,706 A | * | 3/1998 | Thoma | C23C 14/28 |
| | | | | 156/150 |
| 5,725,983 A | * | 3/1998 | Yu | G03G 5/0507 |
| | | | | 430/58.05 |
| 6,766,764 B1 | * | 7/2004 | Chrisey | C23C 14/048 |
| | | | | 118/726 |
| 7,633,035 B2 | * | 12/2009 | Kirmeier | B23K 26/009 |
| | | | | 219/121.68 |
| 7,964,480 B2 | * | 6/2011 | Im | C30B 13/24 |
| | | | | 438/486 |
| 7,994,021 B2 | * | 8/2011 | Miyairi | H01L 27/1266 |
| | | | | 438/455 |
| 2005/0123243 A1 | * | 6/2005 | Steckl | G02B 26/02 |
| | | | | 385/40 |
| 2007/0031097 A1 | * | 2/2007 | Heikenfeld | G02B 26/02 |
| | | | | 385/129 |

OTHER PUBLICATIONS

Fifth International Symposium on Laser Precision Microfabrication, vol. 5662, No. 1, Jan. 1, 2004, one page.
International Search Report for PCT/EP2013/074806 mailed Jan. 8, 2014, five pages.

* cited by examiner

PROCESS OF DEPOSITING A METALLIC PATTERN ON A MEDIUM

This application is the U.S. national phase of International Application No. PCT/EP2013/074806 filed 27 Nov. 2013 which designated the U.S. and claims priority to EP 12194391.4 filed 27 Nov. 2012, the entire contents of each of which are hereby incorporated by reference.

The invention relates to a process of depositing a metallic pattern on a medium, said process comprising: generating pulsed laser beams from a pulsed laser source, focussing the laser beams onto a target layer, said target layer producing ejecta in response to an interaction of said laser beams and said target layer, accumulating at least a portion of said ejecta on said medium within the desired pattern, providing the metallic pattern by electroless metal plating. Said process is typically used to produce a conductive pattern on a transparent medium. The invention further relates to a transparent medium comprising a metallic pattern.

The above-mentioned process is known from Hanada et. al. (Appl. Phys.A 80, 111 -115 (2005). Hanada describes a process for selective metallization of polyimide (PI) by a pulsed laser radiating using a gold film target layer behind the PI, followed by metal plating using an electroless plating solution. The wavelength of the pulsed laser is a wavelength for which the PI has an excellent transparency. The pulsed laser passes through the PI medium first and than is absorbed by a target layer, either bulk Au or an Au film, resulting in generation of laser-induced plasma ejecta from the target layer surface. With a short enough distance between the target layer and the PI medium the plasma attacks the rear surface of the PI medium. Due to interaction of the plasma and the laser beam, ablation takes place at the rear side of the PI. After the ablation process the surface is cleaned, followed by metal plating using an electroless plating solution. A disadvantage of the process described by Hanada is a poor adhesion between the metallic patter and the medium.

Providing a pattern on a transparent medium is also described in US 20100227133. US 20100227133 describes a process of depositing a pattern on a medium, said process comprising: generating pulsed laser beams from a pulsed laser source, focussing the laser beams onto a target layer, said target layer producing ejecta in response to an interaction of said laser beams and said target layer, providing the desired pattern by accumulating at least a portion of said ejecta on said medium. A disadvantage of this method is that said method requires a long time, before a conductive pattern is obtained.

An object of the present invention is to provide a process of depositing a metallic pattern on a medium with an improved adhesion between the metallic pattern and the medium.

According to the invention this object is reached by a target layer comprising inorganic particles, dispersed in a laser light degradable/combustible organic matrix.

As a result of using a target layer comprising inorganic particles, the adhesion between a metallic plating and the medium improved significantly with respect to the adhesion obtained by state of the art methods. An advantage of the process of the invention is that different types of inorganic materials can be used like metal-oxides. Compared to a pure metal target layer as described by Hanada, thinner and more precise patterns can be made. With respect to US 20100227133 the time to produce a conductive pattern is significantly shorter.

In the process of the present invention, the target layer comprises inorganic particles, dispersed in a laser light degradable/combustible organic matrix. Generally the inorganic particles and the organic matrix are mixed and pressed to a plaque or plate, or casted as a film. Preferably the target layer is a casted film, as with a casted film a thinner and more precisely defined pattern can be made, compared to compressed inorganic oxides.

The target layer comprises preferably between 20-80 wt. % of inorganic particles, more preferably between 30-75 wt. % and even more preferably 40-60 wt. % of inorganic particles. Below 20 wt % the amount of ejecta produced in response to an interaction with the laser beams is too low, therefore the plating time becomes undesirably long. Above 80 wt % of inorganic particles, the ablation process becomes ineffective as well.

The inorganic material in the process of the present invention preferably comprises metal particles, or a metal oxide, or a metal salt, or any combination thereof. If the inorganic material comprises a metal, the metal is preferably selected from the group of gold, platinum, palladium, silver copper, bismuth, nickel, iron antimony or alloys of these metals. A metal oxide is preferably selected from the oxides of bismuth, iron, copper, antimony or nickel. A metal salt may be selected from the group consisting of palladium-acetate, copper-acetate or copper-iodide. The inorganic material used is chosen such that the redox potential of the metal in the inorganic material is higher than the redox potential if the metal to be plated. The inorganic material consists of particles [having a particle size distribution] with a median particle size, measured by the method according to D50, of less than 5 μm, preferably less than 1 μm, more preferably less than 0.5 μm.

The laser light degradable/combustible organic matrix can be a thermoplastic or a thermoset polymer.

The thermoplastic polymer can be selected from the group consisting of: polyesters, polyamides, polycarbonates, polyolefin, polyurethanes, thermoplastic silicones, thermoplastic acrylates, PLA, PEEK, PI, polystyrene, polysulfone and poly-ether-imide. The thermoset polymer is a thermoset from the group of polyacrylates, a thermoset polyesters, a thermoset epoxy, a thermoset phenolic, a thermoset alkyd, a thermoset polyurethanes, a thermoset melamine, thermoset rubbers like silicon or EPDM, thermosetting polyimides, or thermoset cyanate esters. Condensation, radiation or thermal curing can cure the organic matrix. Radiation curing with UV, gamma or electro beam curing is preferred. The organic matrix comprises preferably less than 5 wt %, more preferably less than 3 wt % and even more preferably less than 1 wt % of aromatic groups based on the total weight of the organic matrix. With more than 5 wt % of aromatic groups, the amount of ejecta produced in response to an interaction with the laser beams is too low, wherefore the plating time becomes undesirably long.

The organic matrix is preferably a thermoset polymer. A thermoset polymer results in a better adhesion between the pattern and the medium than a thermoplastic polymer.

In the process of the present invention, the laser beams are guided through a laser-transparent medium first and focused on the target layer. The target layer is preferably a film coated on a supporting substrate, made of any desired material e.g. glass or metal, In response to an interaction of said laser beams and said target layer, ejecta are produced, which are transferred backwardly, in a reverse direction to the incident laser beams, and deposited on the medium. In the process of the invention, the target layer can be positioned in contact with the medium, or at a distance up to 5 mm, preferably up to 1 mm and more preferably up to 5 μm to the medium. An advantage of this process is that it is possible to deposit a metallic pattern on a transparent medium.

As used herein the term "laser-transparent medium" refers to a medium having a combined absorption and reflection for the laser beams emitted by the pulsed laser of less than 50%, preferably less than 20% and most preferably less than 10%. The transmission of the laser-transparent medium is preferably more than 90%. Absorption, reflection and transmission are defined as measured by the method according to NIR spectra using the integrated sphere method in a Perkin Elmer Spectrum 2000. Preferably the laser transparent medium is has a combined absorption and reflection in a range from 355-2000 nm, more preferably in the visible range from 380-780 nm of less than 50%, preferably less than 20% and more preferably less than 10%.

A laser-transparent medium may comprise glass, quartz, sapphire or a composition comprising a polymer. Compositions comprising a polymer may further comprise a filler, provided that the filler is also transparent for the used laser beams, like e.g. glass, quartz, pigments or sapphire, or any combination thereof. The medium can be e.g. a sheet, a tube, or a bottle.

As a source for the laser beams different lasers can be used. Examples of such lasers working in the wavelength ranges mentioned above are CO2 lasers (10.6 μm), Nd:YAG lasers (1064, 532, 355, 266 nm) and excimer lasers of the following wavelengths: F2 (157 nm), ArF (193 nm), KrCl (222 nm), KrF (248 nm), XeCl (308 nm) and XeF (351 nm). Preferably Nd:YAG lasers and CO2 lasers are used since these types work in a wavelength range which is very suitable for the induction of thermal processes that are applied for marking purposes.

In the process of the invention the metallic pattern is provided by electroless plating of the patterned medium prepared by the procedure described above. Electroless plating can be carried out according standard processes well known in the state of the art and described in for instance Fundamental Aspects of Electroless Copper Plating in Electroless Plating: Fundamentals and Application by Mallory and Hajdu, 1990.

EXAMPLES

In the examples below the target layer comprises inorganic particles (A1-A5) and organic matrices (R1, R2)
A1 Bismuth oxide $Bi_2O_3$
A2 Copper oxide (Cu(I)O or, Cu(II)O
A3 Iron oxide $Fe_2O_3$
A4 Copper iodide (Cu (I)I
A5 Metallic salts (M-acetate, where M is Pd, or Cu)
R1 Neorad DSM-AGI Aliphatic urethane acrylate diluted with 20% DPGDA including.
R2 Irgacure 819 Photoinitiator Ciba Specialty Chemicals As the substantially transparent medium sheets of the following materials are used:
P1 Bionate® 55D DSM Thermoplastic Polycarbonate Urethane
P2 Arnite® A06 101 DSM Polyether-ester-terephthalate
P3 Xantar 18R Mitsubishi Engineering-Plastics Corporation Polycarbonate
P4 RILSAN® Clear G350 ARKEMA Polyamide
All amounts are in parts per weight.
Method of Preparation of the Target Layer (TL)
Using a Ultra Turrax homogenizer of IKA a number of coating layers including absorber additives where produced. TL02-TL06 were produced, as well as a comparative example TL01. The compositions of the TLs are given in Table 1. The homogenizer speed was 1000 rounds/min.at room temperature.

TABLE 1

| | Laser-marking additive | | |
|---|---|---|---|
| Compound | Resin (R1) | UV-Initiator(R2) | Absorber |
| TL 01 = Comparative Metal | | | Copper plate |
| TL 02.0 | 58 | 2 | 40 (A1) |
| TL 03.0 | 58 | 2 | 40 (A2) |
| TL 03.1 | 48.3 | 1.7 | 50 (A2) |
| TL 03.2 | 38.7 | 1.3 | 60 (A2) |
| TL 04.0 | 58 | 2 | 40 (A3) |
| TL 04.1 | 48.3 | 1.7 | 50 (A3) |
| TL 04.2 | 38.7 | 1.3 | 60 (A3) |
| TL 05 | 58 | 2 | 40 (A4) |
| TL 06 | 58 | 2 | 40 (A5) |

Method of Curing the Target Layer.

Coatings where applied to a glass substrate using a coating applicator bar from Byk with a predefined layer thickness. Following these samples where cured using a UV-H lamp under N2 atmosphere. The applied energy was 2 joule/cm². After the UV curing step a thermal post cure was done in a convection oven at 80° C. for 24 hours.

Method of Transferring the Metal Seeds from the Cured TL to the Medium

Through the transparent medium a pattern was written on the coating layer compositions using a diode pumped Nd:YAG IR laser from Trumpf, type Vectomark Compact, wavelength 1064 nm. The target layer was positioned against the medium.

Method of Plating the Transparent Medium

The transparent medium was plated using a commercial available plating bath (Enthone Inc.) at 48° C. receipt as described in table 2.

TABLE 2

| Standard recipe for the preparation of a Copper plating bath. | | |
|---|---|---|
| Product name | Make up concentration [mL/L] | Content |
| ENPLATE LDS CU400 A PC | 80 | Copper/Formaldehyde/Stabilizers |
| ENPLATE LDS CU400 B | 160 | Complexer |
| ENPLATE LDS CU400 C PC | 10-15 | NaOH/Stabilizers |
| ENPLATE LDS CU400 D | 20-35 | NaOH/Accelerators |
| ENPLATE LDS CU400 E | 0.125 | Wetting Agent |

Evaluation of Plating Performance.

The marking speed (v [mm/sec]) and frequency (f [kHz]) are varied at given power (p [%]) and focal distance (z=0 [in focus]. An evaluation of the plating performance with respect to copper growth on the surface of the plastic substrate and adhesion ranging from excellent (+++++) to poor (-----)is given in table 3.

The plating performance is judged visually by observing the deposited amount of copper on the laser activated area and the edge sharpness.

The adhesion performance was rated by a nail scratch test. An evaluation of the plating performance with respect to copper grow on the surface of the plastic substrate and adhesion ranging from excellent (+++++) to poor (-----)is given in table 3.

TABLE 3

Plating performance and adhesion performance.

| Example | Used medium | Target layer | Plating performance | Adhesion performance | Adhesion strength (N/cm) |
|---|---|---|---|---|---|
| Comp. Ex. | P1 | Cu plate TL01 | +++-- | -------- | <1 |
| 1 | P1 | TL02 | ++++- | +++-- | 3-4 |
| 2 | P1 | TL03.0 | +++++ | +++++ | 5 |
| 3 | P1 | TL03.1 | +++++ | ++++++ | 6-8 |
| 4 | P1 | TL03.2 | +++++ | +++++++ | 10 |
| 5 | P1 | TL04.0 | +++++ | +++++ | 5 |
| 6 | P1 | TL04.1 | +++++ | +++++++ | 6-8 |
| 7 | P1 | TL04.2 | +++++ | ++++++++ | 10 |
| 8 | P1 | TL05 | +++++ | +++++ | 5 |
| 9 | P1 | TL06 | +++++ | ++--- | 3 |
| 10 | P2 | TL02 | +++++ | +++-- | 3-4 |
| 11 | P2 | TL03.0 | +++++ | +++++ | 5 |
| 12 | P2 | TL04.0 | +++++ | +++++ | 5 |
| 13 | P2 | TL05 | +++++ | +++++ | 5 |
| 14 | P2 | TL06 | +++++ | ++--- | 3 |
| 15 | P3 | TL02 | +++++ | +++-- | 3-4 |
| 16 | P3 | TL03.0 | +++++ | +++++ | 5 |
| 17 | P4 | TL03.0 | +++++ | +++++ | 5 |

The adhesion strength was also measured with a quantitative test method for adhesion of plated LDS-MIDs. A peel test according to DIN 51 221, part 1 was carried out using a Zwick/Roell Peel Testing machine. The test was performed at 20° C. With the prior art sample the adhesion was below 1 N/cm.

The samples made by the process of the present invention have an adhesion strength well above 5 N/cm and values above 10 N/cm could be obtained as well. The invention further relates to a transparent medium comprising a metallic pattern wherein the adhesion between the metallic pattern and the medium is at least 1 N/cm, preferably at least 5 N/cm and more preferably at least 10 N/cm.

The invention claimed is:

1. A process for depositing a metallic pattern on a medium, wherein the process comprises:
    i) generating pulsed laser beams from a pulsed laser source, wherein the laser beams have a wavelength for which the medium is substantially transparent to thereby provide a laser-transparent medium,
    ii) guiding the laser beams through the laser-transparent medium and focusing the laser beams which are guided through the laser-transparent medium onto a target layer comprising inorganic particles dispersed in a laser light degradable/combustible organic matrix thereby causing the target layer to produce ejecta in response to an interaction of the laser beams and the target layer,
    iii) accumulating at least a portion of the ejecta transferred backwardly on the medium within the desired pattern,
    iv) providing the pattern by electroless metal plating.

2. The process according to claim 1, wherein the concentration of the inorganic particles in the organic matrix is between 20 and 80 wt %.

3. The process according to claim 1, wherein the target layer comprising inorganic particles is a casted film.

4. The process according to claim 1, wherein the organic matrix is a thermoset polymer.

5. The process according to claim 4, wherein the organic matrix comprises less than 5 wt % of aromatic groups based on the total weight of the organic matrix.

* * * * *